US00RE35111E

United States Patent [19]

Liou et al.

[11] E Patent Number: Re. 35,111

[45] Reissued Date of Patent: Dec. 5, 1995

[54] LOCAL INTERCONNECT PROCESS FOR INTEGRATED CIRCUITS

[75] Inventors: Fu-Tai Liou; Yih-Shung Lin, both of Carrollton, Tex.; Fusen E. Chen, Milpitas, Calif.

[73] Assignee: SGS-Thomson Microelectronics, Inc., Carrollton, Tex.

[21] Appl. No.: 984,084

[22] Filed: Nov. 30, 1992

Related U.S. Patent Documents

Reissue of:

[64] Patent No.: 4,978,637
Issued: Dec. 18, 1990
Appl. No.: 359,860
Filed: May 31, 1989

[51] Int. Cl.[6] ..... H01L 21/283

[52] U.S. Cl. ..... 437/193; 437/192; 437/200

[58] Field of Search ..... 437/200, 193, 437/192; 148/DIG. 19; 156/656, 657

[56] References Cited

U.S. PATENT DOCUMENTS

| | | | |
|---|---|---|---|
| 4,470,189 | 9/1984 | Roberts et al. | 437/200 |
| 4,640,738 | 2/1988 | Fredericks et al. | 156/656 |
| 4,690,730 | 9/1987 | Tang et al. | 156/643 |
| 4,708,904 | 11/1987 | Shimizu et al. | 437/200 |
| 4,740,484 | 4/1988 | Norström et al. | 437/200 |
| 4,774,204 | 9/1988 | Havemann | 437/54 |
| 4,886,764 | 12/1989 | Miller et al. | 437/200 |

FOREIGN PATENT DOCUMENTS

| | | | |
|---|---|---|---|
| 3131875 | 3/1982 | Germany | 437/193 |
| 2077993 | 12/1981 | United Kingdom . | |

*Primary Examiner*—T. N. Quach
*Attorney, Agent, or Firm*—Felsman, Bradley Gunter & Dillon

[57] ABSTRACT

A silicide layer, to improve conductivity, is formed over a first layer of polycrystalline silicon, followed by a second layer of polycrystalline silicon. This structure is then patterned to form gate regions over active areas. A layer of metal silicide is formed over the entire surface of the chip, and patterned to form local interconnect. Etching of the second metal silicide layer is stopped by the second polycrystalline silicon layer, thereby protecting the rust metal silicide layer from damage.

18 Claims, 2 Drawing Sheets

LOCAL INTERCONNECT PROCESS FOR INTEGRATED CIRCUITS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to integrated electronic circuits, and more specifically to a method for fabricating local interconnect on integrated circuits.

2. Description of the Prior Art

The use of local interconnect technology is important for the fabrication of high density integrated circuits. As used herein, local interconnect will be used to refer generally to signal lines used to connect conducting regions which are more or less physically adjacent. Local interconnect is laid down and patterned without an intervening layer of oxide or other insulator through which contact vias must be formed.

High density memory and gate array integrated circuits can make advantageous use of local interconnect technology. For example, local interconnect can be used in a 6 transistor SRAM cell to reduce cell size. An example of the use of local interconnect for this purpose is shown in the paper VLSI LOCAL INTERCONNECT LEVEL USING TITANIUM NITRIDE, T. Tang et al., proceedings of the IEDM 1985, pages 590–593. The process described in such paper uses titanium nitride, which is formed as a by-product of other process steps, as a local interconnect in a 6 transistor SRAM cell U.S. Pat. No. 4,804,636 illustrates a similar use of titanium nitride as a local interconnect for VLSI MOS integrated circuits. In this patent, a layer of titanium nitride which is formed during a process step for forming titanium disilicide is used for local interconnect and contact pads. This patent illustrates the use of local interconnect in an SRAM cell Several properties of the material used for local interconnect in integrated circuits are important to overall functionality of the completed circuit. These include stability of the interconnect material during subsequent thermal cycles, and the long term integrity of the material. The material used must be stable and have long term integrity for use in high performance and reliable integrated circuit parts.

In the references described above, titanium nitride was used primarily because titanium forms a silicide over polycrystalline or monocrystalline silicon, and they can be etched selectively. This allows removal of selected titanium nitride regions without the potential of adversely impacting silicide regions formed out of the same titanium layer. However, the long term integrity, and stability during subsequent thermal cycles, of the titanium nitride used for local interconnect is not as good as desired for reliable integrated circuits.

It would be desirable to provide a method for forming local interconnect for integrated circuits which can be used to form such interconnect from a material which has long term stability and stability during subsequent thermal cycles.

SUMMARY OF THE INVENTION

It is an object of the present invention to provide a method for fabricating local interconnect structures during integrated circuit processing.

It is another object of the present invention to provide such a method which does not introduce undesired complexity into the integrated circuit fabrication process.

It is a further object of the present invention to provide such a method for fabricating local interconnect which provides interconnect formed from a stable and reliable material.

Therefore, in accordance with the present invention, a silicide layer, to improve conductivity, is formed over a first layer of polycrystalline silicon, followed by second layer of polycrystalline silicon. This structure is then patterned to form gate regions over active areas. A layer of metal silicide is formed over the entire surface of the chip, and patterned to form local interconnect.

Etching of the second metal silicide layer is stopped by the second polycrystalline silicon layer, thereby protecting the first metal silicide layer from damage.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. FIGS. 1–4 represent a cross-section of a portion of an integrated circuit during fabrication. The figures are not drawn to scale, but instead are drawn so as to illustrate the important features of the invention.

Figure 1:
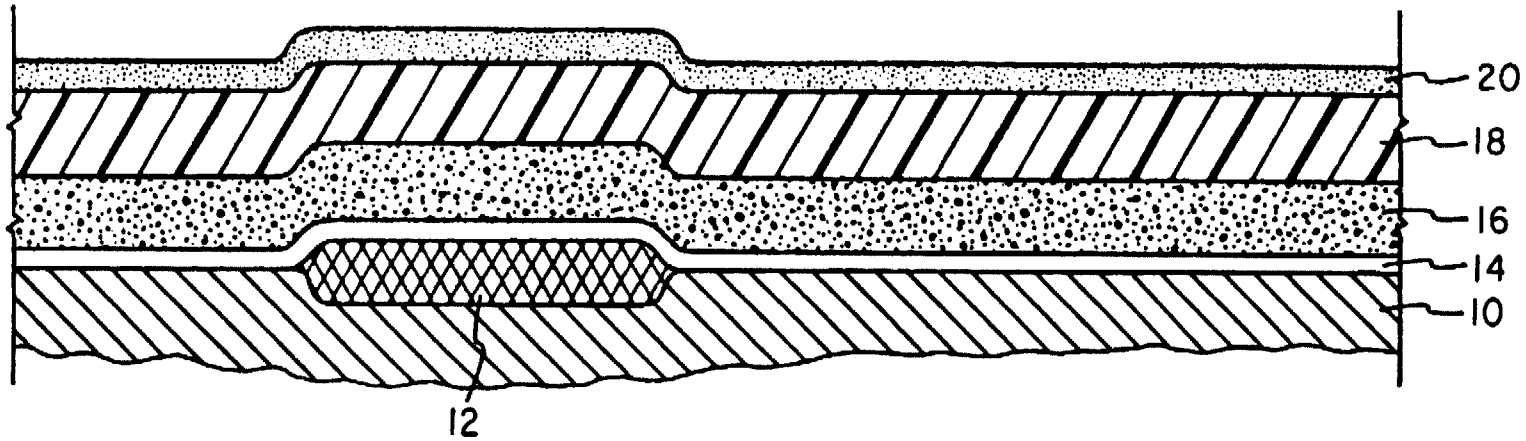
FIGS. 1–4 illustrate steps of a semiconductor integrated circuit fabrication process according to the present invention.

Referring to FIG. 1, a substrate 10 is provided as known in the art for fabrication of integrated circuits. The substrate 10 has previously undergone processing steps to prepare it for information of gate oxide and gate electrode layers. Thus, if the present invention is used in connection with a CMOS process, P and N wells will have already been formed, and the necessary threshold voltage adjust implants have been made. Active areas in the substrate 10 are separated by a relatively thick thermal oxide 12, also known as a field oxide.

A thin gate oxide layer 14 is grown over the entire substrate 10, followed by a polycrystalline silicon layer 16. A layer of tantalum disilicide ($TaSi_2$) is sputtered onto the chip, followed by a polycrystalline silicon layer 20. The gate oxide layer 14 will typically be approximately 100 to 500 angstroms thick, according to the process technology used in the chip. The polycrystalline silicon layer 16 and $TaSi_2$ layer 18 are each approximately 2,000 angstroms thick, and the polycrystalline silicon cap layer 20 is approximately 500 angstroms thick.

A phosphorous implant is then made to the entire surface of the chip. This doping or will dope both polycrystalline silicon layers 16, 20 to be conductive N-type. The $TaSi_2$ layer 18 is transparent to the phosphorous implant, so that a single implant step can be used to dope both polycrystalline silicon layers 16, 20.

Figure 2:
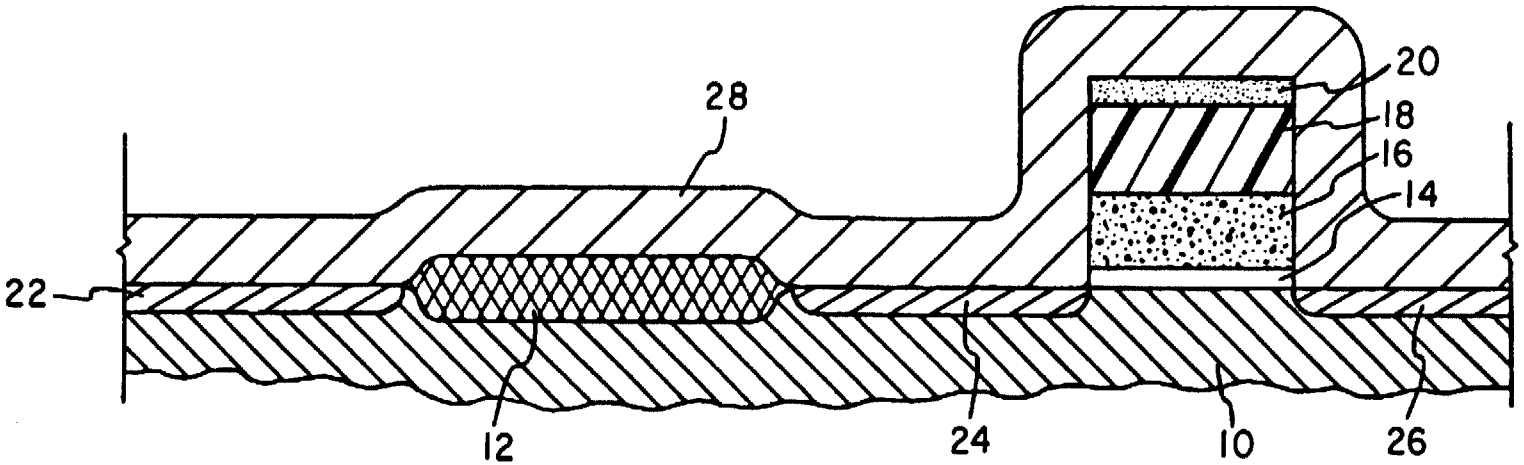
Figure 3:
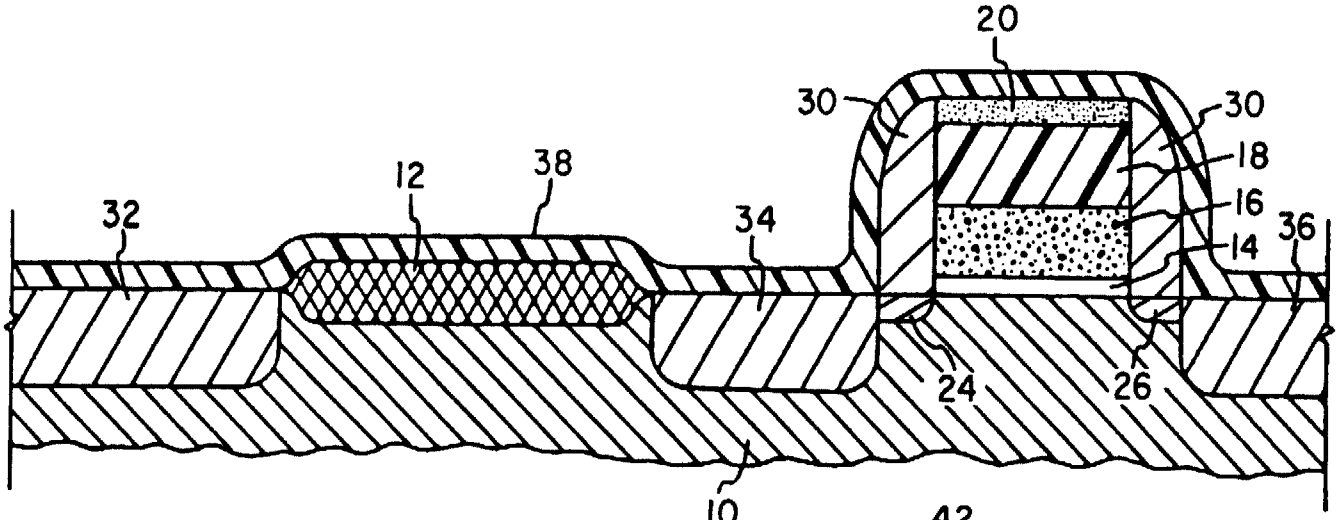

Referring to FIG. 2, the surface of the chip is then patterned and etched to form gates over the active regions. N- and P-implants are then made to form lightly doped drain (LDD) regions 22, 24, 26. After LDD implant and anneal, an undoped low temperature oxide (LTO) layer 28 is deposited over the entire chip using chemical vapor deposition.

Referring to FIG., 3, LTO layer 28 is etched back using an anisotropic plasma etch, resulting in sidewall spacers 30 alongside the gate. Heavily doped source/drain regions 32, 34, 36 are then formed by ion implantation and anneal as known in the art. A layer of $TaSi_2$ 38 is then sputtered on over the surface of the chip. This layer 38 will be used for local interconnect, and is preferably approximately 1,000 angstroms thick.

Figure 4:
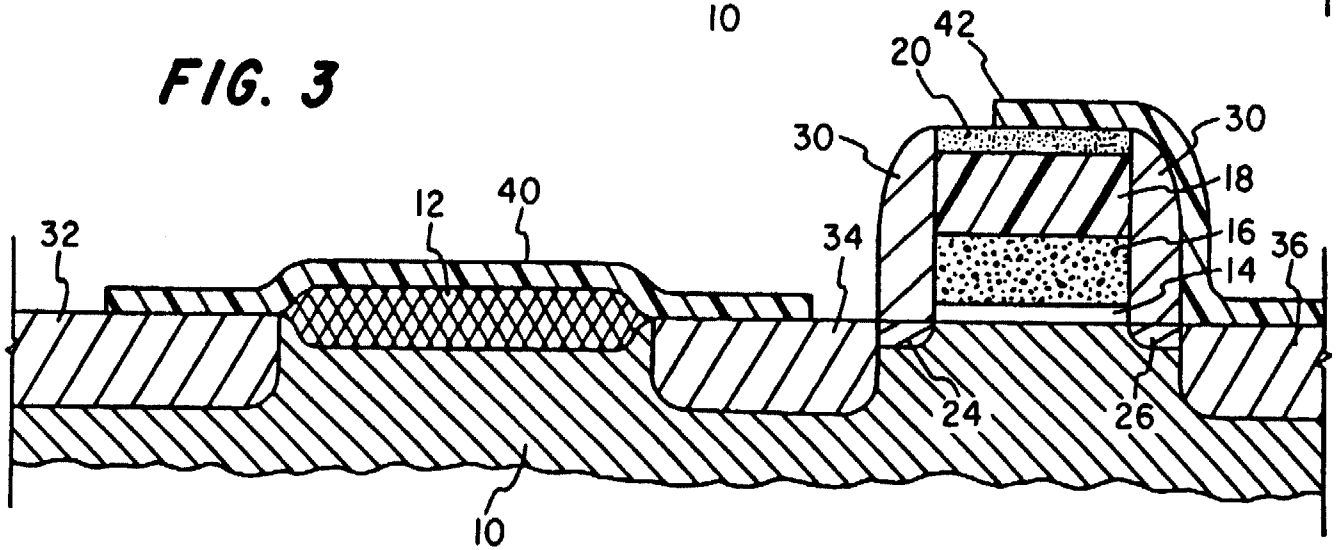

Referring to FIG. 4, the $TaSi_2$ layer 38 is patterned and etched to form local interconnect lines 40 and 42. Local interconnect 40 connects two separate source/drain regions 32, 34 separated by field oxide 12. Local interconnect 42 connects source/drain region 36 with the gate. Contact with the gate is made through polycrystalline silicon cap layer 20, which is conductive.

When the $TaSi_2$ layer 38 is being etched, an etchant is used which is selective for tantalum disilicide over silicon and silicon dioxide, Thus, bare silicon, such as seen in source/drain regions 32 and 34, acts as an etch stop for the patterning step. Also, the polycrystalline silicon cap layer 20 acts as an etch stop for removal of tantalum disilicide over the gate. This protects the $TaSi_2$ layer 18, which would otherwise be damaged during the etch step used to remove unwanted portions of the layer 38.

From the point shown in FIG. 4, processing continues in the usual manner. Typically, an oxide layer would be deposited over the chip, followed by opening contacts to active areas, gates, and local interconnect regions. The remainder of the processing of the chip occurs according to standard industry practice.

The process described above provides a method for forming local interconnect from a stable material such as $TaSi_2$. The polycrystalline cap layer 20 protects the silicide layer in the gates from being damaged during the local interconnect patterning step. Only a single gate poly doping step is needed to dope two layers of polycrystalline silicon because the $TaSi_2$ layer is transparent to the phosphorous implant. Other materials, such as refractory metals or other metal silicides, can be used in place of $TaSi_2$ without changing the process. Whenever a material is used for local interconnect which cannot be conveniently selectively etched for over the gate silicide layer, the conductive polycrystalline cap layer 20 protects such gate silicide layer. Other materials which provide selective etch capability over the local interconnect material can be used instead of the polycrystalline silicon cap layer 20.

While the invention has been particularly shown and described with reference to a preferred embodiment, it will be understood by those skilled in the art that various changes in form and detail may be made therein without departing from the spirit and scope of the invention.

I claim:

1. A method for forming electrical interconnections in an integrated circuit, comprising the steps of:

forming a gate oxide layer on a substrate;

forming a gate polycrystalline silicon layer over the gate oxide layer, forming a first conductive layer including metal over the gate polycrystalline silicon layer;

forming a conductive cap layer over the tint conductive layer including metal;

patterning the gate oxide, gate polycrystalline silicon, first conductive layer including metal, and conductive cap layers to form gates over active regions in the substrate;

forming sidewall insulating regions on the gates;

forming a second conductive layer including metal over the integrated circuit; and patterning the second conductive layer including metal to form electrical interconnections, wherein the conductive cap layer protects the tint conductive layer from damage during such patterning step and wherein the second conductive layer makes electrical contact with the gates through the conductive cap layer, whereby electrical connections are made between the gates and the substrate through the second conductive layer.

2. The method of claim 1 wherein the first and second [conducive] *conductive* layers including metal are formed from the same conductive material.

3. The method of claim 2, wherein the conductive material is a refractory metal.

4. The method of claim 2, wherein the conductive material is a refractory metal silicide.

5. The method of claim 4, wherein the refractory metal silicide is tantalum disilicide.

6. The method of claim 1, wherein the conductive cap layer is formed from polycrystalline silicon.

7. The method of claim 6 further comprising the step of:

after said conductive cap layer forming step, introducing impurities into the gate polycrystalline silicon layer and the conductive cap layer to improve their conductivity.

8. The method of claim 7, wherein the impurities are introduced by a single implant step.

9. The method of claim 7 wherein the introduced impurities comprise phosphorous.

*10. A method for forming electrical interconnections in an integrated circuit,*

*forming a gate oxide layer on a substrate;*

*forming a gate polcrystalline silicon layer over the gate oxide layer;*

*forming a first electrically conductive layer, containing a refractory metal material, over the gate polycrystalline silicon layer;*

*forming a conductive cap layer over the first electrically conductive layer;*

*patterning the gate oxide, gate polycrystalline silicon, electrically conductive layers, and conductive cap layers to form gates over active regions;*

*forming sidewall insulating regions on the gates;*

*forming a second electrically conductive layer, containing a refractory metal material, over the integrated circuit; and*

*patterning the second electrically conductive layer to form electrical interconnections, wherein the conductive cap layer protects the first electrically conductive layer from damage during such patterning step, and wherein the second electrically conductive layer makes electrical contact with the gates through the conductive cap layer, whereby electrical connections are made*

*between the gates and the substrate through the second electrically conductive layer.*

*11. The method of claim 10, wherein the first and second electrically conductive layers are formed from the same refractory metal material.*

*12. The method of claim 11, wherein the refractory metal material comprises a refractory metal.*

*13. The method of claim 11, wherein the refractory metal material comprises a refractory metal silicide.*

*14. The method of claim 13, wherein the refractory metal silicide comprises tantalum disilicide.*

*15. The method of claim 10, wherein the conductive cap layer comprises polycrystalline silicon.*

*16. The method of claim 15, further comprising the step of:*

*after said conductive cap layer forming step, introducing impurities into the gate polycrystalline silicon layer and the conductive cap layer to improve their conductivity.*

*17. The method of claim 16, wherein the impurities are introduced by a single implant step.*

*18. The method of claim 16, wherein the introduced impurities comprise phosphorous.*

* * * * *